United States Patent
Ootomo et al.

(10) Patent No.: US 8,559,179 B2
(45) Date of Patent: Oct. 15, 2013

(54) SUBSTRATE UNIT AND ELECTRONIC DEVICE

(75) Inventors: Hisashi Ootomo, Kawasaki (JP); Tomonori Ezoe, Kawasaki (JP)

(73) Assignee: Kabushiki Kaisha Toshiba, Tokyo (JP)

(*) Notice: Subject to any disclaimer, the term of this patent is extended or adjusted under 35 U.S.C. 154(b) by 329 days.

(21) Appl. No.: 13/005,874

(22) Filed: Jan. 13, 2011

(65) Prior Publication Data

US 2011/0304989 A1 Dec. 15, 2011

(30) Foreign Application Priority Data

Jun. 14, 2010 (JP) ................................. 2010-135367

(51) Int. Cl.
*H05K 7/20* (2006.01)
(52) U.S. Cl.
USPC .......... 361/704; 361/715; 361/719; 165/80.2; 165/185; 174/16.3
(58) Field of Classification Search
None
See application file for complete search history.

(56) References Cited

U.S. PATENT DOCUMENTS

| | | | | |
|---|---|---|---|---|
| 5,414,592 A * | 5/1995 | Stout et al. | ..................... | 361/704 |
| 5,483,420 A * | 1/1996 | Schiavini | ..................... | 361/707 |
| 5,859,764 A * | 1/1999 | Davis et al. | ..................... | 361/704 |
| 5,949,650 A * | 9/1999 | Bulante et al. | ................ | 361/704 |
| 5,999,407 A * | 12/1999 | Meschter et al. | ............ | 361/704 |
| 6,205,023 B1 * | 3/2001 | Moribe et al. | ................ | 361/704 |
| 6,246,582 B1 * | 6/2001 | Habing et al. | ................ | 361/704 |
| 6,771,504 B2 * | 8/2004 | Barcley | ......................... | 361/704 |
| 6,873,528 B2 * | 3/2005 | Hulan et al. | .................. | 361/719 |
| 6,982,877 B2 * | 1/2006 | Vinson et al. | ................. | 361/719 |
| 7,349,221 B2 * | 3/2008 | Yurko | ............................ | 361/719 |
| 8,223,494 B2 * | 7/2012 | Bult | ............................... | 361/700 |
| 2006/0109631 A1 * | 5/2006 | Marro et al. | .................. | 361/718 |

FOREIGN PATENT DOCUMENTS

JP 2008-226890 9/2008

OTHER PUBLICATIONS

"American National Standard for VME64 Extensions", ANSI/VITA Jan. 1994, VMEbus International Trade Association, American National Standards Institute, Inc., Oct. 7, 1998, 6 pages.
"IEEE Standard for Mechanical Core Specifications for Conduction-Cooled Eurocards", IEEE Std 1101.2-992, IEEE Computer Society, 1992, 5 pages.

* cited by examiner

*Primary Examiner* — Boris Chervinsky
(74) *Attorney, Agent, or Firm* — Oblon, Spivak, McClelland, Maier & Neustadt, L.L.P.

(57) ABSTRACT

According to one embodiment, a substrate unit includes an electronic circuit substrate which includes a first width dimension portion, and a second width dimension portion continuous with the front direction side of the first width dimension portion. A first concave portion is formed on the first direction side of the first width dimension portion and a second concave portion is formed on the second direction side of the first width dimension portion in the electronic circuit substrate. The substrate unit includes a heat sink which includes a first side frame portion fixed to the first width dimension portion from the first concave portion, a second side frame portion fixed to the first width dimension portion from the second concave portion, and a sink main body portion continuous from the first side frame portion to the second side frame portion.

11 Claims, 8 Drawing Sheets

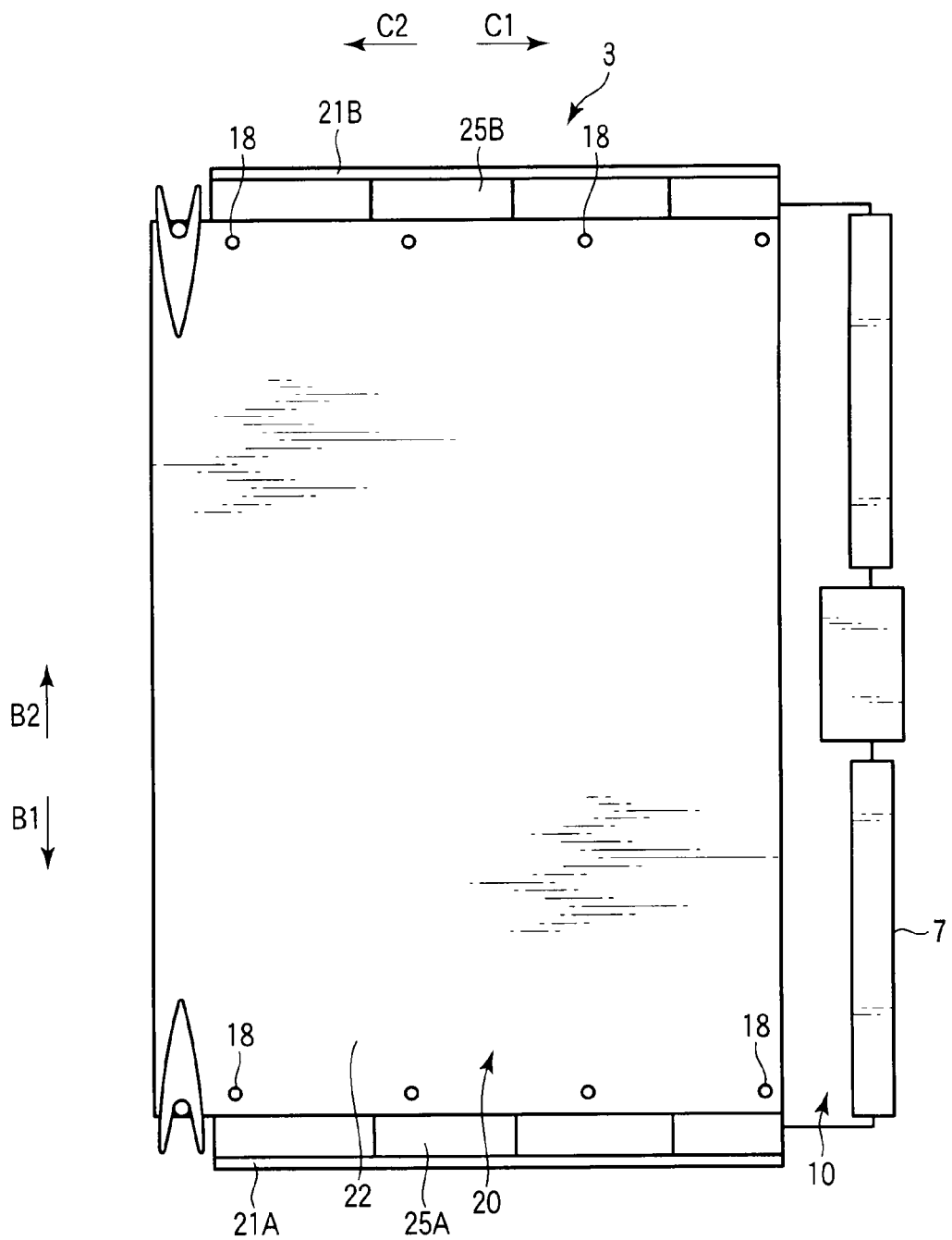
F I G. 2

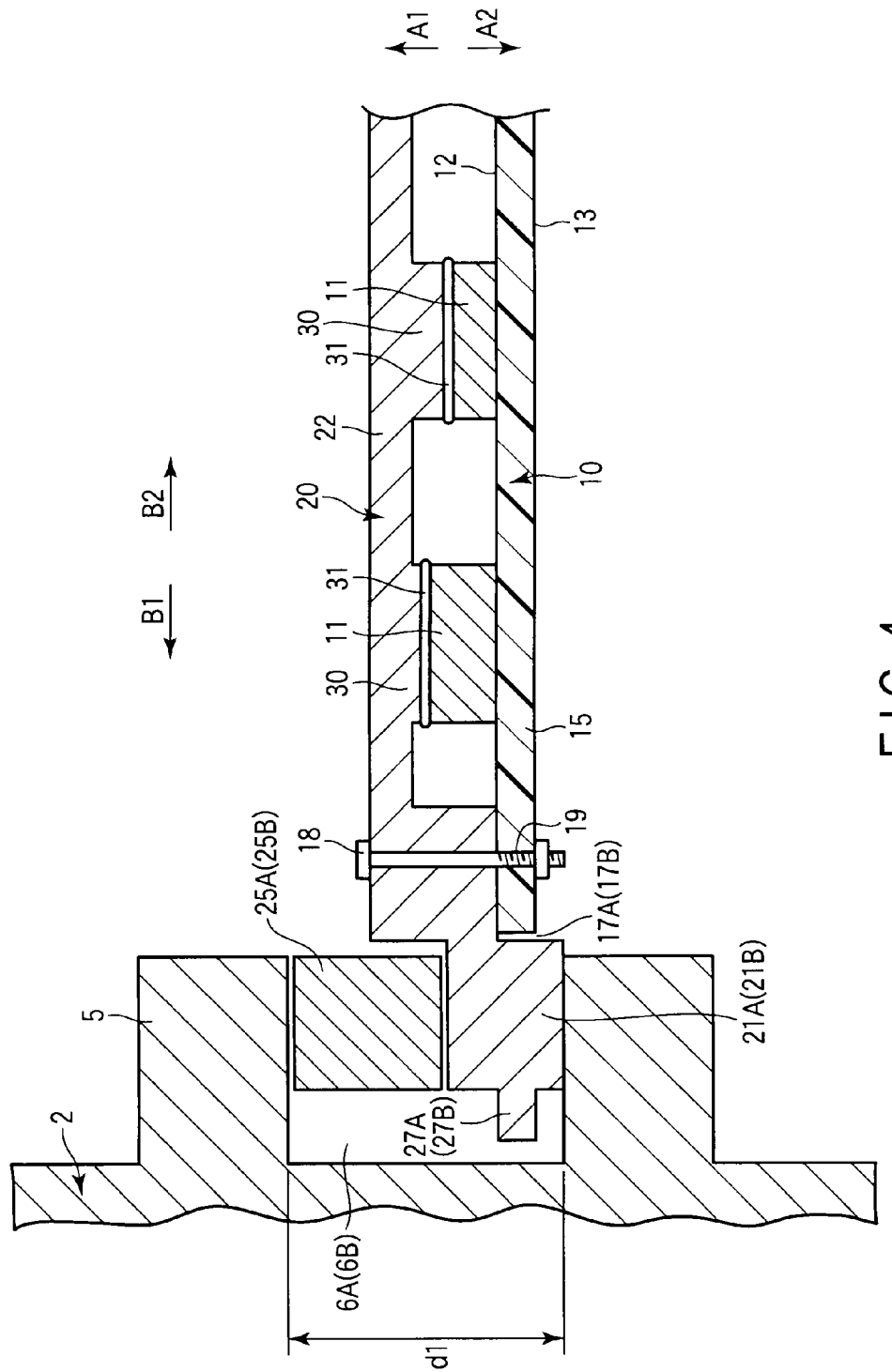
F I G. 4

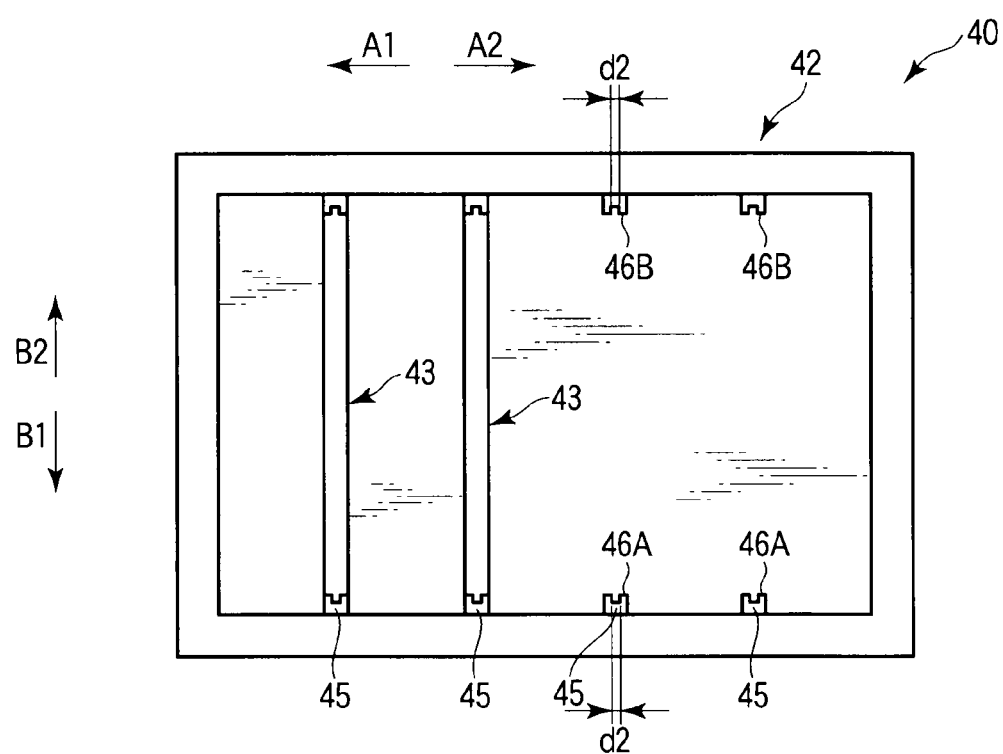
F I G. 5

SUBSTRATE UNIT AND ELECTRONIC DEVICE

CROSS-REFERENCE TO RELATED APPLICATIONS

This application is based upon and claims the benefit of priority from Japanese Patent Application No. 2010-135367, filed Jun. 14, 2010; the entire contents of which are incorporated herein by reference.

FIELD

Embodiments described herein relate generally to a substrate unit inserted into and attached to a rack type housing and an electronic device including this substrate unit.

BACKGROUND

As electronic devices used in terrestrial industrial instruments or on-board industrial instruments mounted in, e.g., airplanes, for example, there is an electronic device using an electronic circuit substrate formed in conformity to a VME standard, which is a standard of Versa Module Europe (VME). In this electronic device, the electronic circuit substrate is inserted into a substrate attachment portion of a rack type housing formed in conformity to the VME standard and attached to the same in this state. Electronic components such as an electronic module, a power amplifier, a filter, and others are installed on the electronic circuit substrate. Such electronic components generate heat when used.

Generally, in an electronic device used in terrestrial industrial instruments, heat generated by electronic components disposed to an electronic circuit substrate based on the VME standard is efficiently cooled by natural air convection or forced air convection. On the other hand, in space where an on-board industrial instrument mounted in, e.g., aerospace-related devices, airplanes is used, air convection is not produced. Therefore, in an electronic device used in the on-board industrial instrument, a plurality of column supports are provided to protrude on an electronic circuit substrate, and a radiation heat sink is disposed to the column supports on the electronic circuit through fixation screws. The heat generated by electronic components installed on the electronic circuit substrate is conducted to a rack type housing through the heat sink. As a result, the heat generated by the electronic components is radiated.

BRIEF DESCRIPTION OF THE DRAWINGS

FIG. 2 is a plan view schematically showing a substrate unit according to the first embodiment;

FIG. 4 is a cross-sectional view showing an attachment state of the substrate unit with respect to a first rack type housing according to the first embodiment;

FIG. 5 is a front view showing an electronic device according to a second embodiment;

DETAILED DESCRIPTION

In general, according to one embodiment, a substrate unit which is inserted into and attached to a first rack type housing including a first substrate attachment portion or a second rack type housing including a second substrate attachment portion different from the first substrate attachment portion, and in which a first direction vertical to a front direction as an inserting direction with respect to the first rack type housing or the second rack type housing and a second direction as a direction opposite to the first direction are width directions, includes: an electronic circuit substrate which includes a first width dimension portion, and a second width dimension portion continuous with the front direction side of the first width dimension portion, a first concave portion which is concave in the second direction from the second width dimension portion being formed on the first direction side of the first width dimension portion and a second concave portion which is concave in the first direction from the second width dimension portion being formed on the second direction side of the first width dimension portion in the electronic circuit substrate; an electronic component installed on the electronic circuit substrate; and a heat sink which includes a first side frame portion fixed to the first width dimension portion of the electronic circuit substrate from the first concave portion, a second side frame portion fixed to the first width dimension portion of the electronic circuit substrate from the second concave portion, and a sink main body portion continuous from the first side frame portion to the second side frame portion, heat generated by the electronic component being conducted to the heat sink.

First Embodiment

Figure 1:
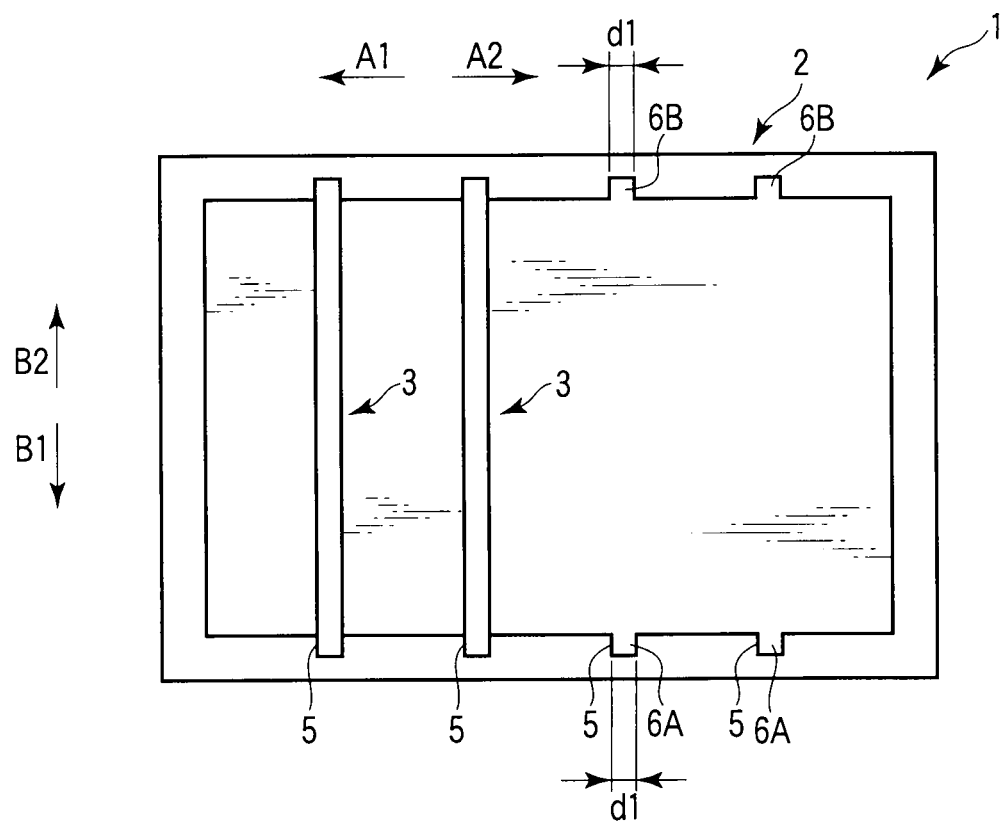
FIG. 1 is a front view showing an electronic device according to a first embodiment.

A first embodiment will now be described with reference to FIG. 1 to FIG. 4. FIG. 1 is a view showing an electronic device 1 used in an industrial instrument according to this embodiment. In this embodiment, the electronic device 1 which is used in an on-board industrial instrument mounted in, e.g., aerospace-related devices, airplanes will be mainly explained. As shown in FIG. 1, the electronic device 1 includes a first rack type housing 2. A plurality of substrate units 3 are inserted into and attached to the first rack type housing 2. The substrate units 3 are provided in parallel along thickness directions (directions of an arrow A1 and an arrow A2 in FIG. 1, FIG. 3, and FIG. 4) of the substrate units 3. Further, in the first rack type housing 2, a plurality of first substrate attachment portions 5 are provided in parallel along the thickness directions of the substrate units 3. One substrate unit 3 is inserted into and attached to each first substrate attachment portion 5 in this state.

Here, one of width directions of the substrate unit 3 is determined as a first direction (a direction of the arrow B1 in FIG. 1 to FIG. 4), and the other (a direction opposite to the first direction) of the width directions of the substrate unit 3 is determined as a second direction (a direction of the arrow B2 in FIG. 1 to FIG. 4). Each first substrate attachment portion 5 includes a first guide groove 6A provided on an inner peripheral surface on the first direction side of the first rack type housing 2 and a second guide groove 6B provided on the inner peripheral surface on a second direction side of the first rack type housing 2. Dimensions and shapes of the first guide groove 6A and the second guide groove 6B of the first rack type housing 2 are set in conformity to the VME standard as a standard used in industrial instruments. According to the VME standard, each of the first guide groove 6A and the second guide groove 6B has a first groove dimension d1 in the thickness directions of the substrate unit 3.

Figure 3:
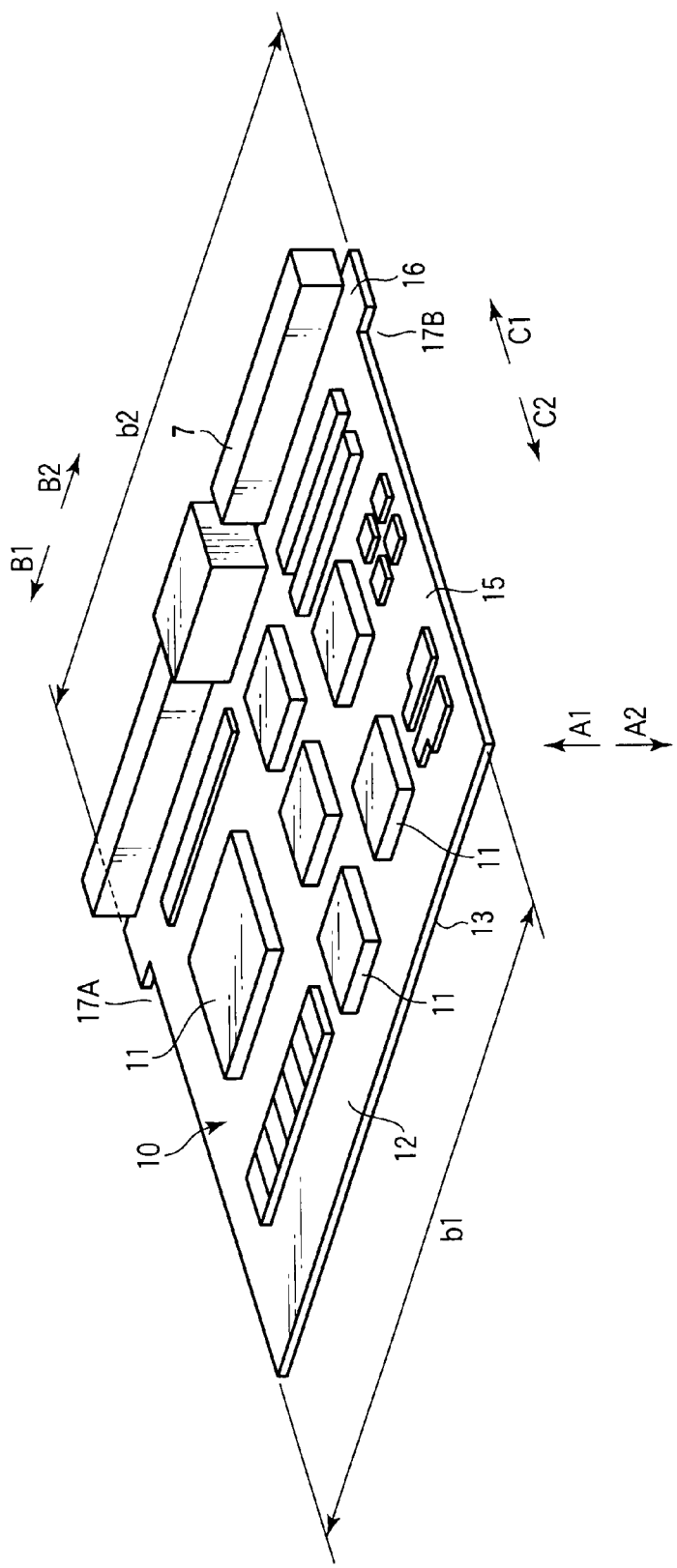
FIG. 3 is a perspective view schematically showing an electronic circuit substrate of the substrate unit according to the first embodiment.

FIG. 2 is a view showing an outline configuration of the substrate unit 3 attached to the first rack type housing 2. Furthermore, FIG. 3 is a view showing an electronic circuit substrate 10 and electronic components 11 of the substrate unit 3. It is to be noted that, in the following description, an inserting direction of the substrate unit 3 into the first rack type housing 2 is determined as a front direction (a direction of an arrow C1 in FIG. 2 and FIG. 3) and a direction opposite to the inserting direction of the substrate unit 3 into the first rack type housing 2 is determined as a back direction (a direction of an arrow C2 in FIG. 2 and FIG. 3).

As shown in FIG. 3, the electronic circuit substrate 10 includes a first plane 12 and a second plane 13 which is a surface on an opposite side of the first plane 12. The plurality of electronic components 11 are installed on the first plane 12 of the electronic circuit substrate 11. Moreover, a connector portion 7 is provided at a region on the front direction side of the first plane 12. In a state that the substrate unit 3 is attached to the first rack type housing 2, the connector portion 7 is connected to a connector portion (not shown) of the first rack type housing 2. As a result, the electronic components 11 installed on the electronic circuit substrate 10 are electrically connected to, e.g., electronic circuits (not shown) provided to the first rack type housing 2.

A dimension and a shape of the electronic circuit substrate 10 are set in conformity to the VME standard. The electronic circuit substrate 10 includes a first width dimension portion 15 extended from a rear end in the front direction and a second width dimension portion 16 continuous with the front direction side of the first width dimension portion 15. A first concave portion 17A which is concave from the second width dimension portion 16 in the second direction is formed on the first direction side of the first width dimension portion 15. A second concave portion 17B which is concave from the second width dimension portion 16 in the first direction is likewise formed on the second direction side of the first width dimension portion 15. Therefore, a first width dimension b1 which is a dimension of the first width dimension portion 15 in the width directions is smaller than a second width dimension b2 which is a dimension of the second width dimension portion 16 in the width directions.

FIG. 4 is a view showing an attachment state of the substrate unit 3 with respect to the first rack type housing 2. As shown in FIG. 4, a heat sink 20 is disposed to the first plane 12 of the electronic circuit substrate 10 through fixation screws 18. The heat sink 20 is formed of a material having high thermal conductivity such as aluminum. The heat sink 20 includes a first side frame portion 21A fixed to the first width dimension portion 15 of the electronic circuit substrate 10 from the first concave portion 17A, a second side frame portion 21B fixed to the first width dimension portion 15 of the electronic circuit substrate 10 from the second concave portion 17B, and a sink main body 22 which is continuous from the first side frame portion 21A to the second side frame portion 21B.

The heat sink 20 is an integral heat sink in which the first side frame portion 21A, the second side frame portion 21B, and the sink main body 22 are integrally formed. Therefore, when the first side frame portion 21A and the second side frame portion 21B are fixed to the first width dimension portion 15 through the fixation screws 18, the heat sink 20 is disposed to the electronic circuit substrate 10. Additionally, since the first side frame portion 21A and the second side frame portion 21B are fixed through the fixation screws 18, in the electronic circuit substrate 10, holes 19 into which the fixation screws 18 are inserted are placed at an end portion on the first direction side of the electronic circuit substrate 10 and an end portion on the second direction side of the same alone. It is to be noted that dimensions of the first side frame portion 21A and the second side frame portion 21B are set in accordance with heights of the electronic components 11 installed on the electronic circuit substrate 10.

A first card lock 25A as a first restriction member is disposed to the first side frame portion 21A. When the substrate unit 3 is attached to one first substrate attachment portion 5 in the first rack type housing 2, the first guide groove 6A holds the first card lock 25A and the first side frame portion 21A. When the first card lock 25A is actuated in this state, movement of the first side frame portion 21A in the back direction in the first guide groove 6A is restricted. Further, a second card lock 25B as a second restriction member is disposed to the second side frame 21B. When the substrate unit 3 is attached to one first substrate attachment portion 5 in the first rack type housing 2, like the first card lock 25A, the second card lock 25B restricts movement of the second side frame portion 21B in the back direction in the second guide groove 6B. As described above, since the movements of the first side frame portion 21A and the second side frame portion 21B are restricted, the substrate unit 3 is prevented from coming off the substrate attachment portion 5.

Furthermore, a first convex portion 27A protruding in the first direction is provided to the first side frame portion 21A. Likewise, a second convex portion 27B protruding in the second direction is provided to the second side frame portion 21B.

The sink main body portion 22 of the heat sink 20 includes a plurality of protruding portions 30 protruding toward the electronic circuit substrate 10. Each protruding portion 30 abuts on the electronic component 11 which is disposed to face on the electronic circuit substrate. A protruding dimension of each protruding portion 30 is set in accordance with a dimension of the opposed electronic component 11 in the thickness directions. For example, each protruding portion 30 is formed by cutting the sink main body portion 22 to a depth corresponding to the dimension of the opposed electronic component 11 in the thickness directions.

Moreover, a radiation sheet 31 as a relay member is provided between the protruding portion 30 of the sink main body portion 22 and the opposed electronic component 11. The radiation sheet 31 is formed of a material, e.g., silicon having lower thermal conductivity than that of the heat sink 20. Since the protruding portion 30 of the sink main body portion 20 is formed by, e.g., cutting work, its abutting surface with respect to the electronic component 11 may be rough. In this case, a gap is produced between the protruding portion 30 and the electronic component 11. Therefore, the radiation sheet 31 fills the gap between the protruding portion 30 and the electronic component 11.

When the above-described configuration is adopted, heat generated by the plurality of electronic components 11 installed on the electronic circuit substrate 10 is conducted to the opposed protruding portions 30 through the radiation sheets 14. Further, the heat conducted to the protruding portions 30 is conducted to the first rack type housing 2 from the sink main body portion 22 of the heat sink 20 via the first side frame portion 21A or the second side frame portion 21B. Furthermore, the heat is radiated from the first rack type housing 2 to the outside of the electronic device 1.

Thus, the electronic device 1 and the substrate unit 3 having the above-described configuration exercise the following technical meanings. That is, in the substrate unit 3 according to this embodiment, the first concave portion 17A is formed on the first direction side of the first width dimension portion 15 of the electronic circuit substrate 10, and the second concave portion 17B is formed on the second direction side of the first width dimension portion 15 of the same. Further, since the first side frame portion 21A is fixed to the first width dimension portion 15 from the first concave portion 17A and the second side frame portion 21B is fixed to the first width dimension portion 15 from the second concave portion 17B, in the electronic circuit substrate 10, the holes 19 into which the fixation screws 18 are inserted are placed at the end portion on the first direction side of the electronic circuit substrate 10 and the end portion on the second direction side of the same alone. The end portion on the first direction side and the end portion on the second direction side in the electronic circuit substrate 10 where the first concave portion 17A, the second concave portion 17B, and the holes 19 are provided are less restricted in terms of a basic design of the electronic circuit substrate 10, e.g., arrangement of the electronic components 11. Moreover, in regard to the heat sink 20, the first side frame portion 21A, the second side frame portion 21B, and when the sink main body portion 22 are integrally formed and the first side frame portion 21A and the second side frame portion 21B are fixed to the first width dimension portion 15, the heat sink 20 is disposed to the electronic circuit substrate 10. Therefore, the shape of the heat sink 20 does not have to be complicated. As described above, the basic design of the electronic circuit substrate 10 and the heat sink 20 based on the VME standard can be facilitated, and the heat sink 20 can be readily disposed to the electronic circuit substrate 10.

Additionally, in the electronic device 1 according to this embodiment, the heat generated by the plurality of electronic components 11 attached to the electronic circuit substrate 10 is conducted to the opposed protruding portions 30 through the radiation sheet 14. Further, the heat conducted to the protruding portions 30 is conducted to the first rack type housing 2 from the sink main body portion 22 of the heat sink 20 through the first side frame portion 21A or the second side frame portion 21B. Furthermore, the heat is radiated from the first rack type housing to the outside of the electronic device 1. Therefore, even in space producing no air convection where on-board industrial instruments mounted in, e.g., aerospace-related devices, airplanes are used, the heat generated in the electronic components 11 can be effectively radiated.

Furthermore, in the substrate unit 3 according to this embodiment, the heat sink 20 in which the first side frame portion 21A, the second side frame portion 21B, and the sink main body portion 22 are integrally formed is provided. Therefore, radiation properties and mechanical strength of the heat sink 20 can be improved.

Moreover, in the substrate unit 3 according to this embodiment, the radiation sheet 31 as the relay member is provided between each protruding portion 30 of the sink main body portion 22 and each opposed electronic component 11. As a result, even when the abutting surface of the protruding portion 30 of the sink main body portion 22 with respect to the electronic component 11 is rough, the radiation sheet 30 fills the gap between the protruding portion 31 and the electronic component 11. Therefore, the heat can be more effectively conducted from the electronic component 11 to the sink main body portion 22.

Additionally, in the substrate unit 3 according to this embodiment, the heat sink 20 is formed of a material having higher thermal conductivity than that of the radiation sheet 31. As a result, a large part of a heat transfer route from the electronic component 11 to the first rack type housing 2 is constituted of the heat sink 20 having the high thermal conductivity. Therefore, the heat generated by each electronic component 11 can be effectively radiated.

Second Embodiment

A second embodiment will now be described with reference to FIG. 5 to FIG. 8. It is to be noted that like reference numerals denote parts equal to those in the first embodiment or parts having the same functions to omit a description thereof.

FIG. 5 is a view showing an electronic device 40 for use in an industrial instrument according to this embodiment. In this embodiment, the electronic device 40 used in a terrestrial industrial instrument will be mainly explained. As shown in FIG. 5, the electronic device 40 includes a second rack type housing 42 different from the first rack type housing 2. A plurality of substrate units 43 are inserted into and attached to the second rack type housing 42. The substrate units 43 are provided in parallel along thickness directions (directions of an arrow A1 and an arrow A2 in FIG. 5, FIG. 7, and FIG. 8) of the substrate units 43. Further, in the second rack type housing 42, a plurality of second substrate attachment portions (guide rails) 45 are provided in parallel along the thickness directions of the substrate units 43. One substrate unit 43 is inserted into and attached to each second substrate attachment portion 45. Each second substrate attachment portion 45 is disposed on an inner peripheral surface of the second rack type housing 42.

Here, one of width directions of the substrate unit 43 is determined as a first direction (a direction of an arrow B1 in FIG. 5 to FIG. 8), and the other of the width directions of the substrate unit 43 (a direction opposite to the first direction) is determined as a second direction (a direction of an arrow B2 in FIG. 5 to FIG. 8). Each second substrate attachment portion 45 includes a first engagement groove 46A provided on the inner peripheral surface of the second rack type housing 42 on the first direction side, and a second engagement groove 46B provided on the inner peripheral surface of the second rack type housing 42 on the second direction side. Dimensions and shapes of the first engagement groove 46A and the second engagement groove 46B of the second rack type housing 42 are set in conformity to the VME standard as a standard used in industrial instruments. According to the VME standard, each of the first engagement groove 46A and the second engagement groove 46B has a second groove dimension d2 in the thickness directions of the substrate unit 43. Here, the second groove dimension d2 is smaller than the first groove dimension d1 of each of the first guide groove 6A and the second guide groove 6B of the first rack type housing 2 (see FIG. 1 and FIG. 4). Furthermore, the second rack type housing 42 includes a built-in cooling fan (not shown) as a cooling member.

Figure 6:
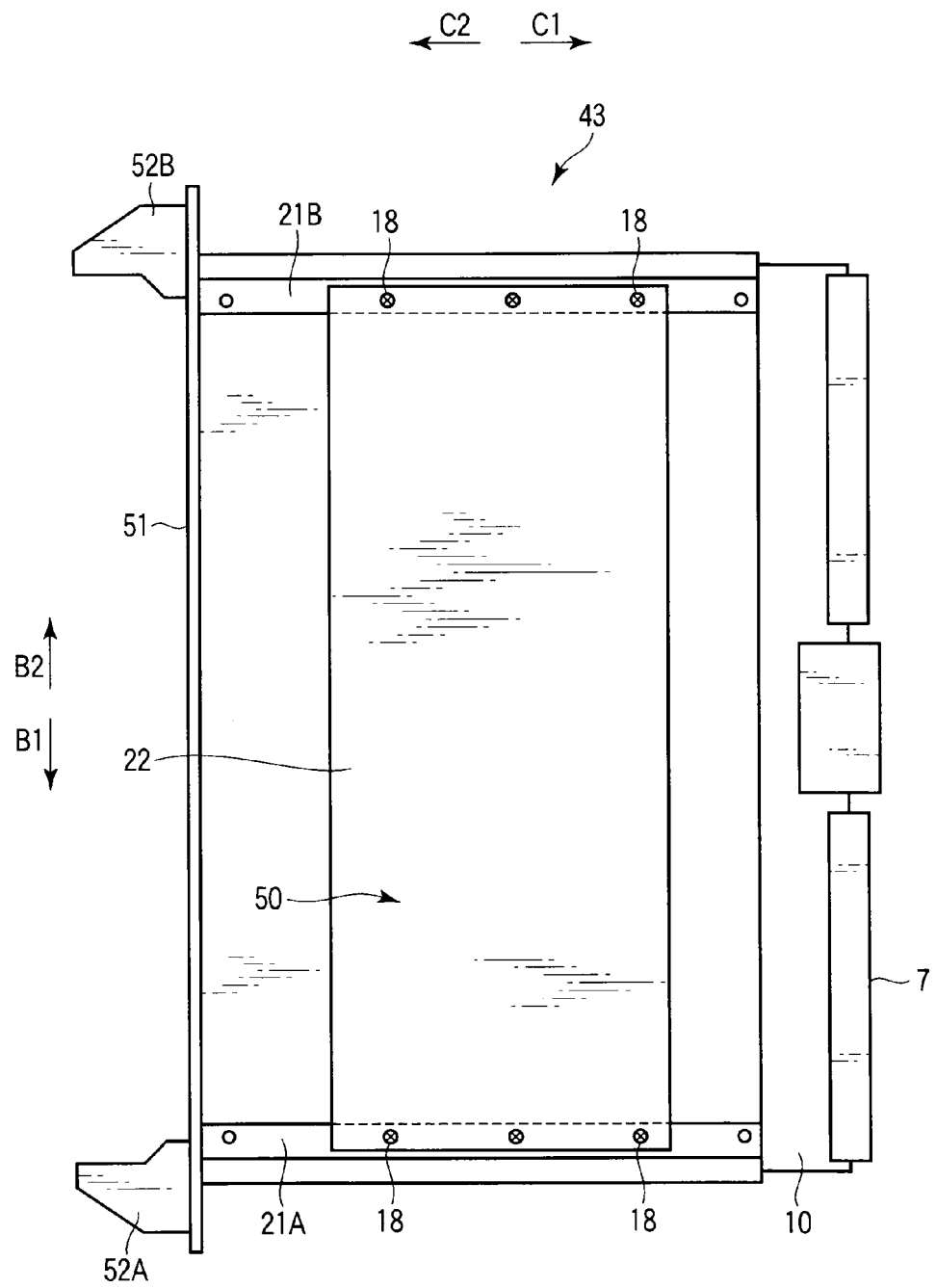
FIG. 6 is a plan view schematically showing a substrate unit according to the second embodiment.
Figure 7:
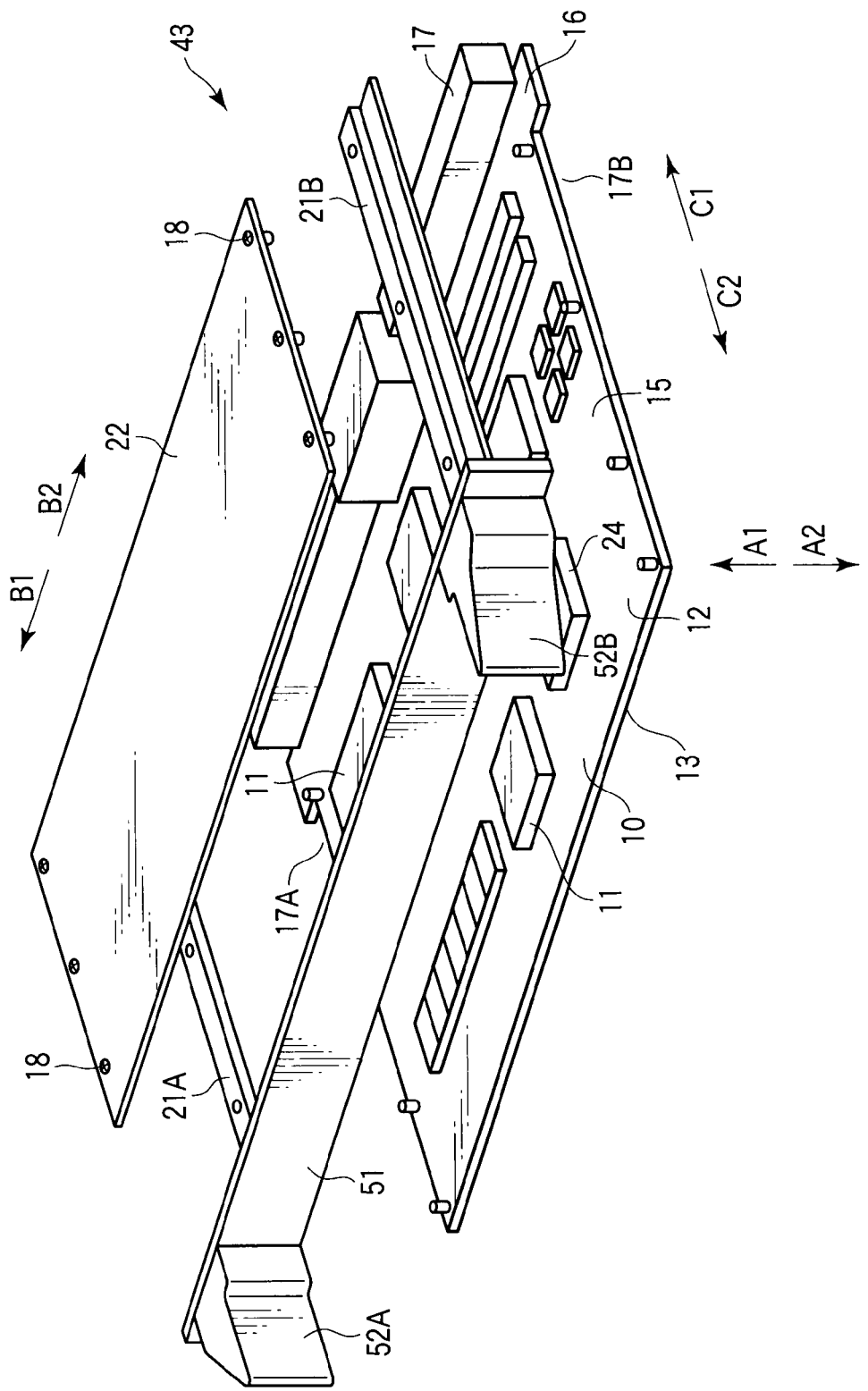
FIG. 7 is an exploded perspective view showing the substrate unit in accordance with each member according to the second embodiment.

Each of FIG. 6 and FIG. 7 is a view showing a configuration of the substrate unit 43 attached to the second rack type housing 42. It is to be noted that, in the following description, an inserting direction of the substrate unit 43 into the second rack type housing 42 is determined as a front direction (a direction of an arrow C1 in FIG. 6 and FIG. 7) and a direction opposite to the inserting direction of the substrate unit 43 into the second rack type housing 42 is determined as a back direction (a direction of an arrow C2 in FIG. 6 and FIG. 7).

As shown in FIG. 7, the substrate unit 43 includes the same electronic circuit substrate 10 as that in the first embodiment.

On the electronic circuit substrate 10, a plurality of electronic components 11 are installed and a connector portion 7 is provided. In a state that the substrate unit 43 is attached to the second rack type housing 42, the connector portion 7 is connected to a connector portion (not shown) of the second rack type housing 42. As a result, each electronic component 11 installed on the electronic circuit substrate 10 is electrically connected with an electronic circuit (not shown) provided to the second rack type housing 42.

Like the first embodiment, the electronic circuit substrate 10 includes a first width dimension portion 15 and a second width dimension portion 16. A first concave portion 17A is formed on the first direction side of the first width dimension portion 15, and a second concave portion 17B is formed on the second direction side of the first width dimension portion 15.

Figure 8:
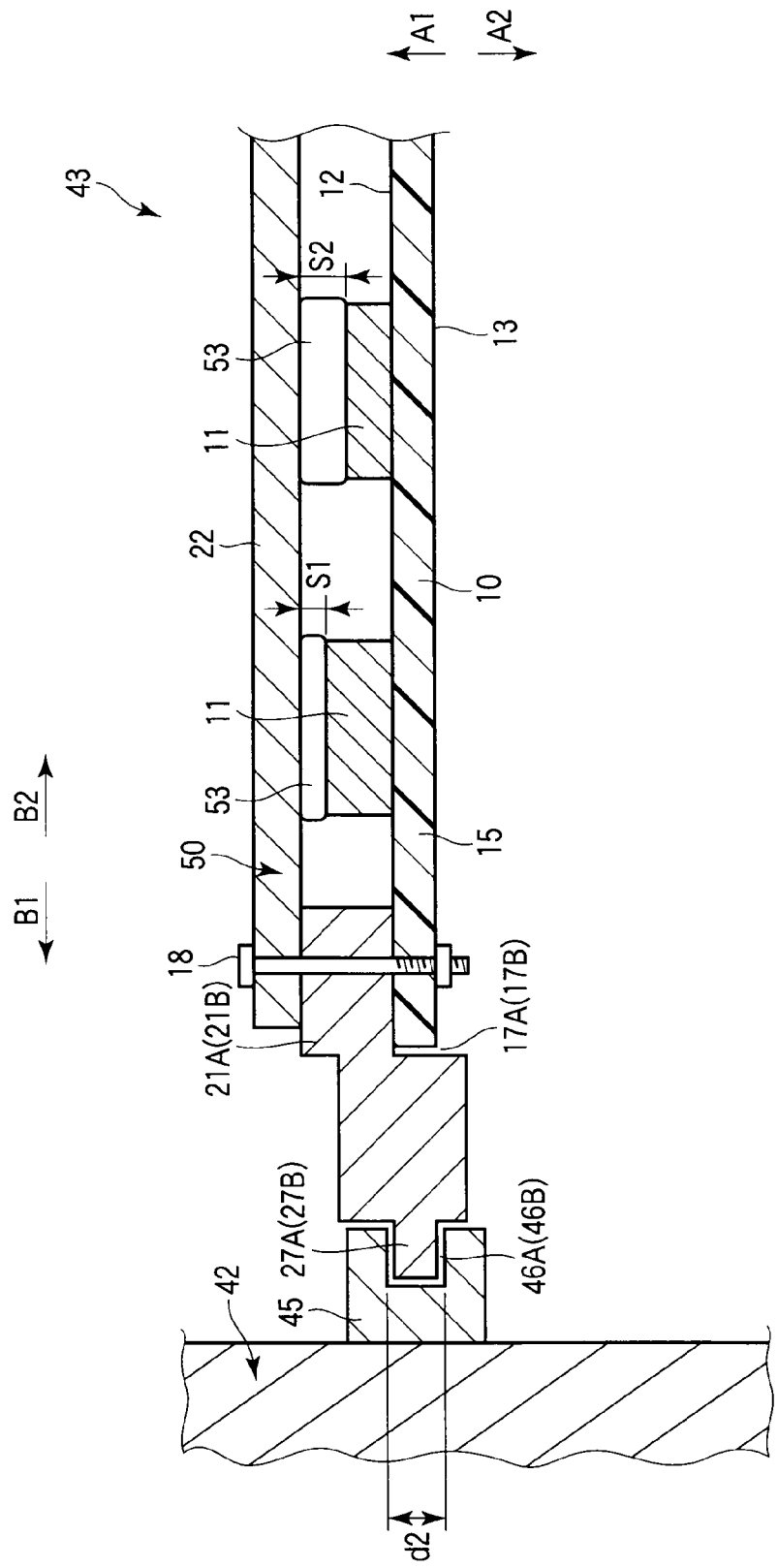
FIG. 8 is a cross-sectional view showing an attachment state of the substrate unit with respect to a second rack type housing according to the second embodiment.

FIG. 8 is a view showing an attachment state of the substrate unit 43 with respect to the second rack type housing 42. As shown in FIG. 8, a heat sink 50 is disposed to a first plane 12 of the electronic circuit substrate 10 through fixation screws 18. The heat sink 50 is formed of a material having high thermal conductivity, e.g., aluminum like the heat sink 20 in the first embodiment. Moreover, the heat sink 50 includes a first side frame portion 21A, a second side frame portion 21B, and a sink main body portion 22 like the heat sink 20 according to the first embodiment.

The heat sink 50 is a coupled heat sink in which the sink main body portion 22 is coupled with the first side frame portion 21A and the second side frame portion 21B through the fixation screws 18. In the heat sink 50, the sink main body portion 22 is formed into a tabular shape. Additionally, the first side frame portion 21A and the second side frame portion 21B are fixed to the first width dimension portion 15 through the fixation screws 18. Therefore, the heat sink 20 is disposed to the electronic circuit substrate 10 by using the fixation screws 18. Further, since the first side frame portion 21A and the second side frame portion 21B are fixed through the fixation screws 18, in the electronic circuit substrate 10, holes 19 into which the fixation screws 18 are inserted are placed at an end portion on the first direction side of the electronic circuit substrate 10 and an end portion on the second direction side of the same alone. It is to be noted that dimensions of the first side frame portion 21A and the second side frame portion 21B are set in accordance with a height of each electronic component 11 installed on the electronic circuit substrate 10.

Furthermore, a first convex portion 27A protruding in the first direction is provided to the first side frame portion 21A. Likewise, a second convex portion 27B protruding in the second direction is provided to the second side frame portion 21B. When the substrate unit 43 is attached to one second substrate attachment portion 45 of the second rack type housing 42, the first convex portion 27A engages with the first engagement groove 46A. Likewise, when the substrate unit 43 is attached to one second substrate attachment portion 45 of the second rack type housing 42, the second convex portion 27B engages with the second engagement groove 46B.

Moreover, a front panel 51 is arranged on the front direction side of the electronic circuit substrate 10. A card lock 52A is attached to a region on the first direction side of the front panel 51, and a card lock 52B is attached to a region on the second direction side of the same. Additionally, when the substrate unit 43 is attached to one second substrate attachment portion 45 of the second rack type housing 42, actuating the card lock 52A enables restricting movement of the first convex portion 27A along the back direction in the first engagement groove 46A. Likewise, actuating the card lock 52A enables restricting movement of the second convex portion 27B along the back direction in the second engagement groove 46B. As described above, since the movements of the first convex portion 27A and the second convex portion 27B are restricted, the substrate unit 43 is prevented from coming off the second substrate attachment portion 45.

Furthermore, a radiation sheet 53 as a relay member that connects each electronic component 11 with the sink main body portion 22 is provided to each electronic component 11 installed on the electronic circuit substrate 10. The radiation sheet 53 is formed of, e.g., silicon like the first embodiment. A dimension of each radiation sheet 53 in the thickness directions is set in accordance with a gap dimension (e.g., S1 or S2) between the electronic component 11 which is to be in contact with the radiation sheet 53 and the sink main body portion 22. That is, the dimension of each radiation sheet 53 in the thickness directions is set in accordance with a dimension in the thickness directions of the electronic component 11 which is to be in contact with the radiation sheet 53. Therefore, the electronic component 11 having any dimension in the thickness directions can become continuous with the sink main body portion 22. Therefore, heat generated by each electronic component 11 is effectively conducted to the sink main body portion 22.

When the heat is generated from the electronic component 11 installed on the electronic circuit substrate 10, the cooling fan (not shown) of the second rack type housing 42 is driven. The heat generated from the electronic component 11 is conducted to the sink main body portion 22, the first side frame portion 21A, and the second side frame portion 21B through the radiation sheet 53. At this time, the heat sink 50 and the electronic component 11 are cooled by cooling air from the cooling fan. However, in the heat sink 50, since the first side frame portion 21A, the second side frame portion 21B, and the sink main body portion 22 are not integrated, thermal conductivity with respect to the first side frame portion 21A and the second side frame portion 21B is lower than that of the heat sink 20 in the first embodiment.

Thus, the electronic device 40 and the substrate unit 43 having the above-described configuration exercise the following technical meanings. That is, in the substrate unit 43 according to this embodiment, the first concave portion 17A is formed on the first direction side of the first width dimension portion 15 of the electronic circuit substrate 10, and the second concave portion 17B is formed on the second direction side of the first width dimension portion 15 of the same. Furthermore, since the first side frame portion 21A is fixed to the first width dimension portion 15 from the first concave portion 17A and the second side frame portion 21B is fixed to the first width dimension portion 15 from the second concave portion 17B, in the electronic circuit substrate 10, the holes 19 into which the fixation screws 18 are inserted are placed at the end portion on the first direction side of the electronic circuit substrate 10 and the end portion on the second direction side of the same alone. The end portion on the first direction side of the electronic circuit substrate 10 and the end portion on the second direction side of the same at which the first concave portion 17A, the second concave portion 17B, and the holes 19 are provided are less restricted in terms of a basic design of the electronic circuit substrate 10, e.g., arrangement of the electronic component 11. Moreover, in the heat sink 50, the first side frame portion 21A and the second side frame portion 21B are fixed to the first width dimension portion 15, and the sink main body portion 22 is coupled with the first side frame portion 21A and the second side frame portion 21B. Therefore, the shape of the heat sink 50 does not have to be complicated. As described above, the basic design of the electronic circuit substrate 10 and the heat sink 50 based on the VME standard can be facilitated, and the heat sink 50 can be easily disposed to the electronic circuit substrate 10.

Additionally, in the substrate unit 43, the sink main body portion 22 is formed into the tabular shape. Further, the sink main body portion 22 is coupled with the first side frame portion 21A and the second side frame portion 21B. Since the heat sink 50 is formed as described above, the heat sink 50 can be manufactured more easily as compared with the heat sink 20 according to the first embodiment.

Furthermore, the substrate unit 43 adopts the electronic circuit substrate 10 having the same configuration as that of the substrate unit 3 according to the first embodiment. That is, the substrate unit 3 attached to the first rack type housing 2 and the substrate unit 43 attached to the second rack type housing 42 use the electronic circuit substrate 10 having the same configuration, e.g., the shape or arrangement of the electronic components 11. Therefore, terrestrial and on-board industrial instruments can share the electronic circuit substrate having the same configuration.

(Modification)

It is to be noted that the substrate unit 3 according to the first embodiment may be used in a terrestrial industrial instrument as a modification of the foregoing embodiment. In this case, one substrate unit 3 is inserted into and attached to the second substrate attachment portion 45 of the second rack type housing 42. At this time, the first convex portion 27A engages with the first engagement groove 46A. Likewise, the second convex portion 27A engages with the second engagement groove 46B.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A substrate unit which is inserted into and attached to a first rack type housing including a first substrate attachment portion or a second rack type housing including a second substrate attachment portion different from the first substrate attachment portion, and in which a first direction vertical to a front direction as an inserting direction with respect to the first rack type housing or the second rack type housing and a second direction as a direction opposite to the first direction are width directions, comprising:

an electronic circuit substrate which includes a first width dimension portion, and a second width dimension portion continuous with the front direction side of the first width dimension portion, a first concave portion which is concave in the second direction from the second width dimension portion being formed on the first direction side of the first width dimension portion, a second concave portion which is concave in the first direction from the second width dimension portion being formed on the second direction side of the first width dimension portion in the electronic circuit substrate, and holes being formed at a first direction side end portion of the electronic substrate and at a second direction side end portion of the electronic substrate;

an electronic component installed on the electronic circuit substrate; and a heat sink which includes a first side frame portion fixed to the first width dimension portion of the electronic circuit substrate from the first concave portion, a second side frame portion fixed to the first width dimension portion of the electronic circuit substrate from the second concave portion, and a sink main body portion continuous from the first side frame portion to the second side frame portion, heat generated by the electronic component being configured to be conducted to the heat sink; and fixation members each of which is inserted into the corresponding hole so that the first side frame and the second side frame are fixed to the electronic circuit substrate.

2. The substrate unit according to claim 1, wherein the heat sink is an integral heat sink in which the first side frame portion, the second side frame portion, and the sink main body portion are integrally formed.

3. The substrate unit according to claim 2, wherein the sink main body portion includes a protruding portion which protrudes toward the electronic circuit substrate and which abuts on the electronic component.

4. The substrate unit according to claim 3, wherein a protruding dimension of the protruding portion is set in accordance with a dimension of the electronic component along thickness directions.

5. The substrate unit according to claim 3, further comprising a relay member which is provided between the protruding portion and the electronic component and which fills a gap generated between a rough abutting surface of the protruding portion with respect to the electronic component and the electronic component.

6. The substrate unit according to claim 5, wherein the integral heat sink is formed of a material having higher thermal conductivity than the relay member.

7. An electronic device comprising:

the substrate unit according to claim 2; and the first rack type housing in which the substrate unit is attached to the first substrate attachment portion, wherein the first attachment portion includes a first guide groove provided on an inner peripheral surface of the first rack type housing on the first direction side, and a second guide groove provided on the inner peripheral surface of the first rack type housing on the second direction side, and the substrate unit includes a first restriction member which is disposed to the first side frame portion and which restricts movement of the side frame portion along a back direction in the first guide groove, and a second restriction member which is disposed to the second side frame portion and which restricts movement of the second side frame portion along the back direction in the second guide grove.

8. The substrate unit according to claim 1, wherein the heat sink is a coupled heat sink in which the sink main body portion is coupled with the first side frame portion and the second side frame portion.

9. The substrate unit according to claim 8, further comprising a relay member which connects the electronic component with the sink main body portion, wherein the sink main body portion is formed into a tabular shape.

10. The substrate unit according to claim 9, wherein a dimension of the relay member along thickness directions is set in accordance with a gap dimension between the electronic component and the sink main body portion.

11. An electronic device comprising:

the substrate unit according to claim 8; and the second rack type housing in which the substrate unit is attached to the second substrate attachment portion, wherein the second attachment portion includes a first engagement groove provided on an inner peripheral surface of the second rack type housing on the first direction side, and a second engagement groove provided on the inner peripheral surface of the second rack type housing on the second direction side, and the substrate unit includes a first convex portion which protrudes from the first side frame portion in the first direction and which engages with the first engagement groove, and a second convex portion which protrudes from the second side frame portion in the second direction and which engages with the second engagement groove.

* * * * *